United States Patent [19]

Gokan et al.

[11] Patent Number: 4,983,545

[45] Date of Patent: Jan. 8, 1991

[54] PLANARIZATION OF DIELECTRIC FILMS ON INTEGRATED CIRCUITS

[75] Inventors: Hiroshi Gokan; Masahito Mukainaru; Masayoshi Suzuki; Hisanao Tsuge, all of Tokyo; Hidehiko Matsuya, Kyoto, all of Japan

[73] Assignees: NEC Corporation, Tokyo; Sanyo Chemical Industries, Ltd., Kyoto, both of Japan

[21] Appl. No.: 170,304

[22] Filed: Mar. 18, 1988

[30] Foreign Application Priority Data

Mar. 20, 1987 [JP] Japan ............................. 62-67527
Oct. 30, 1987 [JP] Japan ............................. 62-276518

[51] Int. Cl.$^5$ ................................. H01L 21/465
[52] U.S. Cl. ........................... 437/228; 437/229; 430/311; 430/314; 430/317
[58] Field of Search ............ 437/228, 229, 67, 68; 430/311, 314, 317

[56] References Cited

U.S. PATENT DOCUMENTS 4,222,792  9/1980  Lever et al. ..................... 437/67
4,604,162  8/1986  Sobczak .......................... 437/62
4,665,010  5/1987  Herd et al. ....................... 437/67

FOREIGN PATENT DOCUMENTS 225526  12/1984  Japan .

OTHER PUBLICATIONS

Wolf, "Silicon Processing . . . ", 1986, pp. 452–455.

*Primary Examiner*—Brian E. Hearn
*Assistant Examiner*—Chandra Chaudhari
*Attorney, Agent, or Firm*—Oblon, Spivak, McClelland, Maier & Neustadt

[57] ABSTRACT

A method for the geometry independent planarization of dielectric films on integrated circuits is disclosed.

The method comprises forming the dielectric film, forming a polymer layer which polymer has the viscosity of 5,000 cps or less at 200° C., reducing the viscosity of the polymer under baking to create a planar surface, hardening the polymer by the radiation or the electric beam and etching said polymer layer to transfer the planar surface to said dielectric film.

20 Claims, 4 Drawing Sheets

PLANARIZATION OF DIELECTRIC FILMS ON INTEGRATED CIRCUITS

BACKGROUND OF THE INVENTION

1. Field of the Invention

This invention relates to a method for planarizing dielectric films between conductive layers on semiconductor wafers which are for use in the fabrication of integrated circuits.

2. Description of the Prior Art

The increase of circuit density on silicon chips necessitates increased ability to interconnect large numbers of integrated silicon devices on a single chip.

The dimensional limitation of the active area in an integrated circuit dictates that vertical interconnections are made by means of multilevel metallization. As the circuits become denser and the feature sizes smaller, to topography becomes too sever for conventional multilevel metallization structures to provide acceptable yield or to have acceptable reliability. One way to remove the topography in order to planarize a particular metallization level, is the etch back process. Japanese Patent Lay-Open No. 225526/1984 discloses the etch back process, which comprises forming a dielectric film over the mesa-like portions and the trench region, forming a polymer layer over said dielectric film, which is a polystyrene having a molecular weight of about 100,000, reducing the viscosity of said polymer layer under baking to decrease the initial step height, hardening said polymer by Ultra-Violet or deep-Ultra-Violet irradiation and dry-etching said polymer layer to transfer the polymer surface to said dielectric film. FIG. 1 shows a relationship of pattern width and step height after leveling the polystyrene, which has a molecular weight of 100,000, by baking at 200° C. for an hour under $N_2$ flow condition. The initial step height is 6000 Å. With increasing pattern width, step height increases and is almost the same as the initial step height at step width of 40 μm.

SUMMARY OF THE INVENTION

Figure 1:
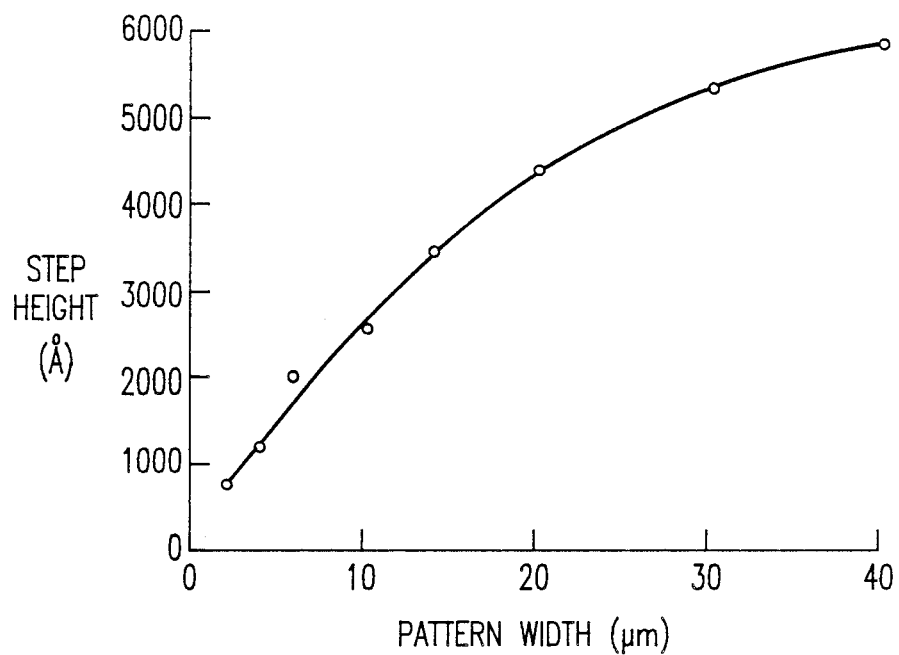
FIG. 1 is a relationship of pattern width and step height after leveling a polystyrene at 200° C. for an hour, which has a weight average molecular weight of 100,000.

It is an object of the present invention to provide methods for the geometry independent planarization of dielectric films on integrated circuits.

It is another object of this invention to provide methods for the geometry independent planarization of dielectric films on integrated circuits without the condensation of a polymer under baking.

It is still another object of this invention to provide a composition for the geometry independent planarization of dielectric films on integrated circuits.

Briefly, these and other objects of the present invention, which will become more readily apparent below have been attained broadly by a method for producing a semiconductor structure over a substrate having a pattern thereon, said pattern comprising mesa-like portions having a trench region therebetween, the steps comprising:

(a) forming a dielectric film with a thickness of 0.1 μm to 10 μm over the mesa-like portions and the trench region;

(b) forming a polymer layer with a thickness of 0.1 μm to 10 μm over said dielectric film, said polymer layer comprising a polymer having a melting viscosity of 5,000 cps or less at 200° C. and the formula;

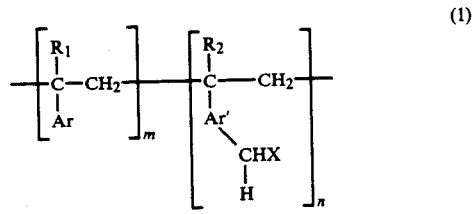

(1)

in which:

$R_1$ is a hydrogen atom, a methyl radical or a halogen atom;

$R_2$ is a hydrogen atom, a methyl radical or a halogen atom;

R is a hydrogen atom a methyl radical;

X is a halogen atom;

Ar is a phenyl radical;

Ar is a phenylene radical;

m and n are zero or a positive integral number;

(c) reducing the viscosity of the polymer under baking at 150° C. to 220° C. for an hour to create a substantially planar surface;

(d) hardening the polymer with the radiation or the electron beam to improve the heat resistance of said polymer layer;

(e) dry-etching said polymer layer to transfer the planar surface to said dielectric film.

And a composition is suitable for planarization of dielectric films, which comprises a polymer and a polysiloxane, said polymer having the melting viscosity of 5,000 cps or less at 200° C. and the formula (1).

DETAILED DESCRIPTION OF THE INVENTION

In formula (1), each of the symbols $R_1$ and $R_2$ is preferably a hydrogen atom or a methyl radical. The symbol X is preferably a chlorine or a fluorine. The symbol m is preferably from zero to 100 and n is preferably from zero to 70.

The sum of m and n is normally from 5 to 100, preferably from 5 to 15.

The ratio of m:n is normally from 95:5 to 10:90, preferably from 90:10 to 40:60.

If the ratio of n/m is less than 5/95, the sensitivity of hardening by the radiation or the electron beam is not enough in the view of the practical use.

And if the ratio of n/m is more than 90/10, the durability to withstand the etching process becomes less, so it is difficult to keep the etching rates of the polymer and the dielectric film equal.

The melting viscosity of the polymer represented by the formula (1) is normally from 1 to 5,000 cps, preferably 1 to 500 cps at 200° C. If the melting viscosity is more than 5,000 cps, it is difficult to create the ideal planar surface, the step height less than 1,000 Å, even at the pattern width of 50 μm or less at 200° C.

A weight average molecular weight [Mw] of the polymer represented by the formula (1) is normally from 500 to 10,000, preferably 500 to 1,500. Polymers having Mw less than 500 are too viscous at room temperature, to control the film thickness. And polymers having Mw more than 10,000 have melting viscosity more than 5,000 cps at 200° C.

A molecular weight distribution [Mw/Mn] is usually from 1.0 to 4.0, preferably less than 1.5, in view of narrowing the range of the softening temperature and lowering the melting viscosity of the polymer.

Examples of suitable polymers represented by formula (1) are as follows;
styrene-chloromethylstyrene copolymer having Mw of 2,500, Mw/Mn of 3.0 and chloromethylstyrene unit of 50 mol %,
styrene-fluoromethylstyrene copolymer having Mw of 4,000, Mw/Mn of 2.5 and fluoromethylstyrene unit of 50 mol %,
styrene-chloromethylstyrene copolymer having Mw of 1,000, Mw/Mn of 1.1 and chloromethylstyrene unit of 50 mol %,
and styrene-fluoromethylstyrene copolymer having Mw of 1,300, Mw/Mn of 1.2 and fluoromethylstyrene unit of 50 mol %, The polymer represented by formula (1) can be prepared for example, by a process in which the monomers of the constitutional units are copolymerized in the presence of a cationic catalyst, for example, Lewis acids such as boron trifluoride etherate, aluminium chloride and titanium tetrachloride, and protic acids such as sulfuric acid, perchloric acid, trifluoroacetic acid and p-toluenesulfonic acid or by a process in which a precursor polymer is produced from styrene or styrene derivetive by the way of a cationic polymerization using a cationic catalyst or an anionic polymerization using an anionic catalyst such as n-butyllithium and sodium naphthalene followed by haloalkylation with a haloalkylating agent such as halomethylmethylether, dihalomethylether and (hydrogen halide+paraformaldehyde) using Lewis acid catalyst such as zinc chloride, ferric chloride and boron trifluoride.

The polymer having the low molecular weight in this invention can be produced by the control of the polymerization temperature, for example, 80°~120° C. in case of the cationic polymerization and by the control of the ratio of a monomer concentration and a catalyst concentration ([monomer]/[catalyst]), for example, [monomer]/[catalyst]=5~100 in case of the anionic polymerization.

As a preferable embodiment of this invention, planarization may be carried out by the following method:
(a) forming a dielectric film with a thickness of 0.1 μm to 10 μm over the mesa-like portions and the trench region;
(b) forming an organic film with a thickness of 10 Å to 1,000 Å containing at least one amino radical and at least one alkoxysilyl radical over said dielectric film;
(c) forming a polymer layer with a thickness of 0.1 μm to 10 μm over said organic film, said polymer layer comprising a polymer having a melting viscosity of 5,000 cps or less at 200° C. and the formula (1);
(d) reducing the viscosity of said polymer layer under baking at 150° C. to 200° C. for an hour to create a substantially planar surface;
(e) hardening the polymer with the radiation or the electron beam to improve the heat resistance of said polymer layer;
(f) dry-etching said polymer layer to transfer the planar surface to said dielectric film.

Said organic film is preferably produced from a compound having the formula (2):

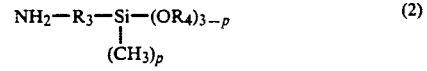

in which:
R$_3$ is a p-phenylene, a trimethylene, a butylene or a dimethyleneaminotrimethylene radical;
R$_4$ is a methyl or an ethyl radical;
P is zero or 1.
Specific examples are as follows
3-aminopropyltrimethoxysilane (sold by Chisso Corp. A-0800), 3-aminopropyltriethoxysilane (sold by Chisso Corp. A-0750), 3-aminopropyltriethoxysilane (sold by Chisso Corp. A-0742), p-aminophenyltriethoxysilane (sold by Chisso Corp. A-0725), γ-(2-aminoethyl)aminopropyltrimethoxysilane (sold by Toray Silicone Co. Ltd. SH-6020), γ-(2-aminoethyl)aminopropylmethyldiethoxysilane (sold by Toray Silicone Co. Ltd. SZ-6023) and 4-aminobutyltriethoxysilane (sold by Chisso Corp. A-0696). Preferable are 3-aminopropyltrimethoxysilane and γ-(2-aminoethyl)aminopropyltrimethoxysilane.

As another preferred embodiment of this invention, planarization may be carried out by the following method:
(a) forming a dielectric film with a thickness of 0.1 μm to 10 μm over the mesa-like portions and the trench region;
(b) forming a polymer layer with a thickness of 0.1 μm to 10 μm over said organic film, said polymer layer comprising a polymer having the melting viscosity of 5,000 cps or less at 200° C., and a polysiloxane;
(c) reducing the viscosity of said polymer layer under baking at 150° C. to 220° C. for an hour to create a substantially planar surface;
(d) hardening the polymer with the radiation or the electron beam to improve the heat resistance of said polymer layer;
(e) dry-etching said polymer layer to transfer the planar surface to said dielectric film.

Suitable polysiloxanes in this invention include, for example, those having the formula:

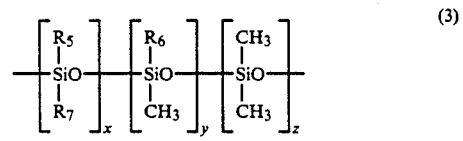

in which:
the symbols R$_5$, R$_6$ and R$_7$ are independently selected from the group consisting of alkyl radicals, substituted alkyl radicals, aryl radicals and substituted aryl radicals;
X, Y and Z are zero or a positive integral number and are not zero at the same time.

In formula (3), the symbols R$_5$, R$_6$ and R$_7$ are selected from alkyl radicals having 2 to 14 carbon atoms (for example, ethyl, propyl, butyl, hexyl, octyl, decyl, dodecyl and tetradecyl radicals), halo-substituted alkyl radicals having 1 to 8 carbon atoms, and 1 to 13 halogen atoms (for example, 3,3,3-trifluoropropyl, 1,1,2,2-tetrahydroperfluorooctyl, chloromethyl and chloropropyl radicals), cyanoethyl radical, alkyl radicals (for example, phenethyl and tolylmethyl radicals), aryl radicals (for example, phenyl and naphthyl radicals) and substituted aryl radicals (for example, alkyl-and/or halo-substituted phenyl radicals such as methylphenyl, chloromethylphenyl, chlorophenyl and tetrachlorophenyl radicals).

Preferable are aryl and substituted aryl radicals, particularly preferable phenyl and chloromethylphenyl radicals.

The sum of the symbols x, y and z is more than 3 and preferably from 10 to 1,000.

The molecular weight of the polysiloxane represented by formula (3) is usually from about 400 to about 100,000.

Specific examples are as follows

Polydimethylsiloxanes (for example, sold by Chisso Corp. PS-038, PS-042 and PS-046), polymethylethylsiloxanes (for example, the molecular weight of 2,000, sold by Chisso Corp. PS-131), polymethyloctylsiloxanes (for example, the molecular weight of 6,200, sold by Chisso Corp. Ps-140), polydimethyl-chloropropylmethylsiloxanes (for example, having the viscosity of 30 to 50 cs and chloropropyl radical of 7.5~12.5 mol %, sold by Chisso Corp. PS-058), polymethyl-3,3,3-trifluoropropylsiloxanes (for example, having the molecular weight of 2,350, sold by Chisso Corp. PS-181), polymethyl-1,1,2,2-tetrahydroperfluorooctylsiloxanes (for example, having the viscosity of 100 to 500 cs, sold by Chisso Corp. PS-185), polycyanopropylmethylsiloxanes (for example, sold by Chisso Corp. PS-906), polymethylphenylsiloxanes (for example, having the viscosity of 500 cs and phenyl radical of 40 mol %, sold by Toray Silicone Co. Ltd. SH-710), polydimethyl-methylphenylsiloxanes (for example, having the viscosity of 100 to 150 cs and phenyl radical of 20 mol %, sold by Toray Silicone Co. Ltd. SH-550) and dimethylsiloxane-tetrachlorophenylmethylsiloxane copolymers (for example, having the viscosity of 70 cs, sold by Chisso Corp. PS-021).

There may also be used in this invention, other polysiloxanes, for example, dimethylsiloxane-ethyleneoxide block copolymers (such as having the viscosity of 130 cs sold by Chisso Corp. PS-073), dimethylsiloxane-α-methylstyrene block copolymers (for example, having the molecular weight of 80,000~100,000, sold by Chisso Corp. PS-096) an dimethylsiloxane-styrene block copolymer.

The quantity of the polysiloxane in a composition in this invention is normally from 0.001% to 40%, preferably from 0.01% to 10% by weight. In view of preventing from the condensation or occuring nonwetting of the polymer layer caused by cohesive energy to reduce its contact with the dielectric film of the polymer, if its quantity is less than 0.001% by weight, its effectiveness cannot be fully exhibited. And if its quantity is more than 40%, it is difficult to control the end-point of etching.

The polymer and the composition of the polymer and the polysiloxane in this invention can be used as a solution in a solvent. Suitable solvents are, for example, aromatic hydrocarbons (such as toluene and xylene) and ester compound (such as ethylcellosolveacetate and methylcellosolveacetate). The concentration of the solution is normally from 10% to 60%, preferably from 25% to 55% by weight.

In order to clarify what polymer characteristics are required for the process, polystyrenes are selected as the starting material because of their excellent dry etching resistance, their low glass transition temperature Tg and the availability of a wide variety of single dispersion molecular weight polymers. The degree of planarization is evaluated by tracing steps at various pattern geometries by Talystep, after coating the polymers over the substrate having a pattern of the step height of 6,200 Å and baking at 200° C. for an hour under $N_2$ flow conditions.

Figure 2:
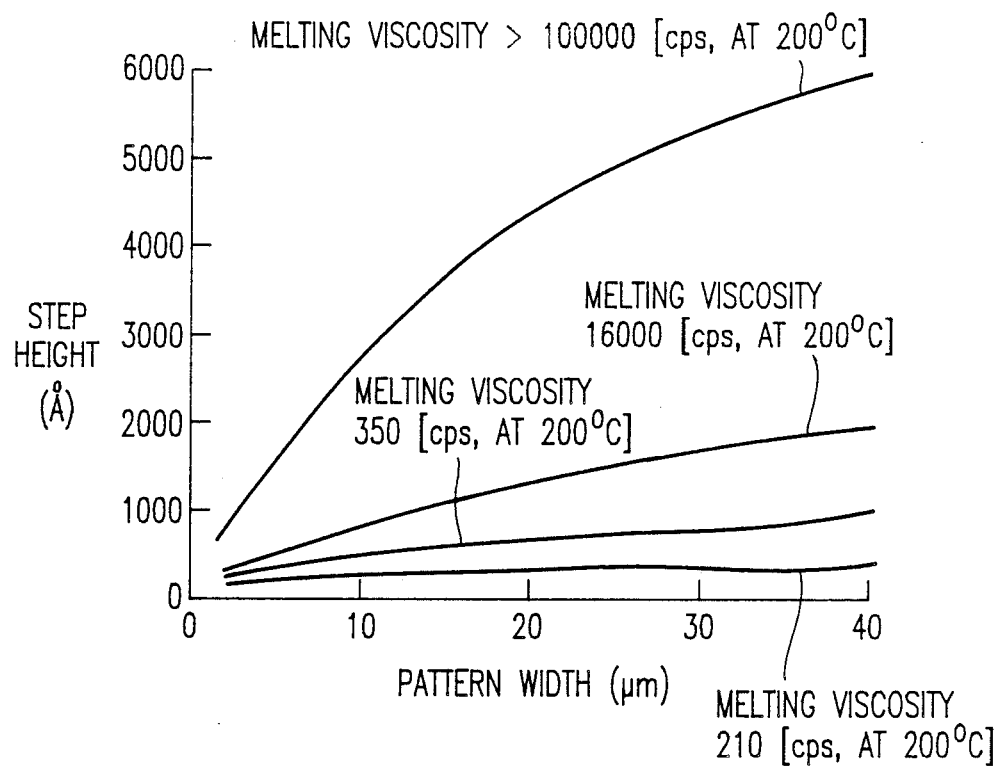
FIG. 2 is a relationship of pattern width and step height after leveling polystyrenes of various melting viscosity at 200° C. for an hour.
Figure 3:
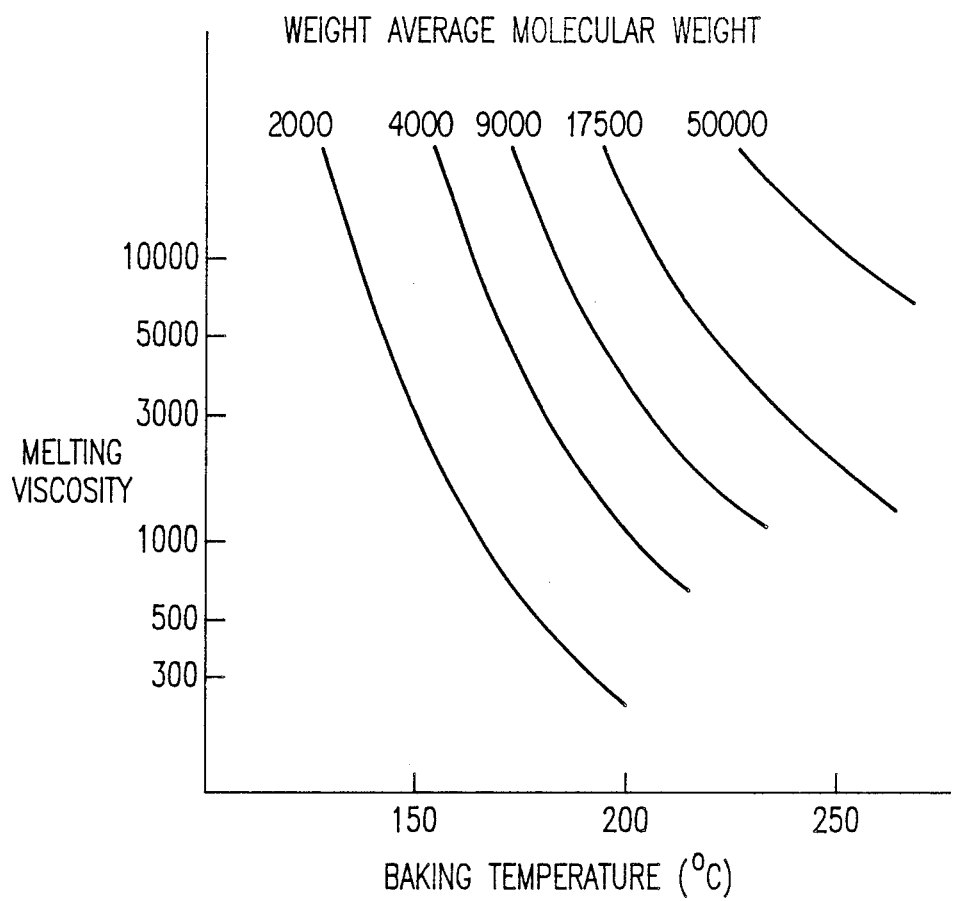
FIG. 3 is a relationship of baking temperature and melting viscosity of polystyrenes having various weight average molecular weight.

As result, it has been found that the planar surface of the dielectric film can be created independently of pattern width by using the polymer which has the melting viscosity of 5,000 cps or less and the formula (1). As shown in FIG. 2, the step height at wide pattern width is dramatically decreased with decreasing the melting viscosity. This suggests that polymers of low melting viscosity flow easily to refill the trench region or recesses, producing there planar surface over a wide range of pattern widths. And the viscosity measured at elevated temperatures under nitrogen is found to correlate closely to these flow characteristics. With increasing temperature and with reduced polymer molecular weights, the melting viscosity greatly decreased, as shown in FIG. 3. These results show that the degree of planarization is mainly determined by the melting viscosity at elevated temperatures. But if the temperature of baking is more than 220° C., said polymer is decomposed by heat and the planar surface of said polymer can't be created.

Figure 4:
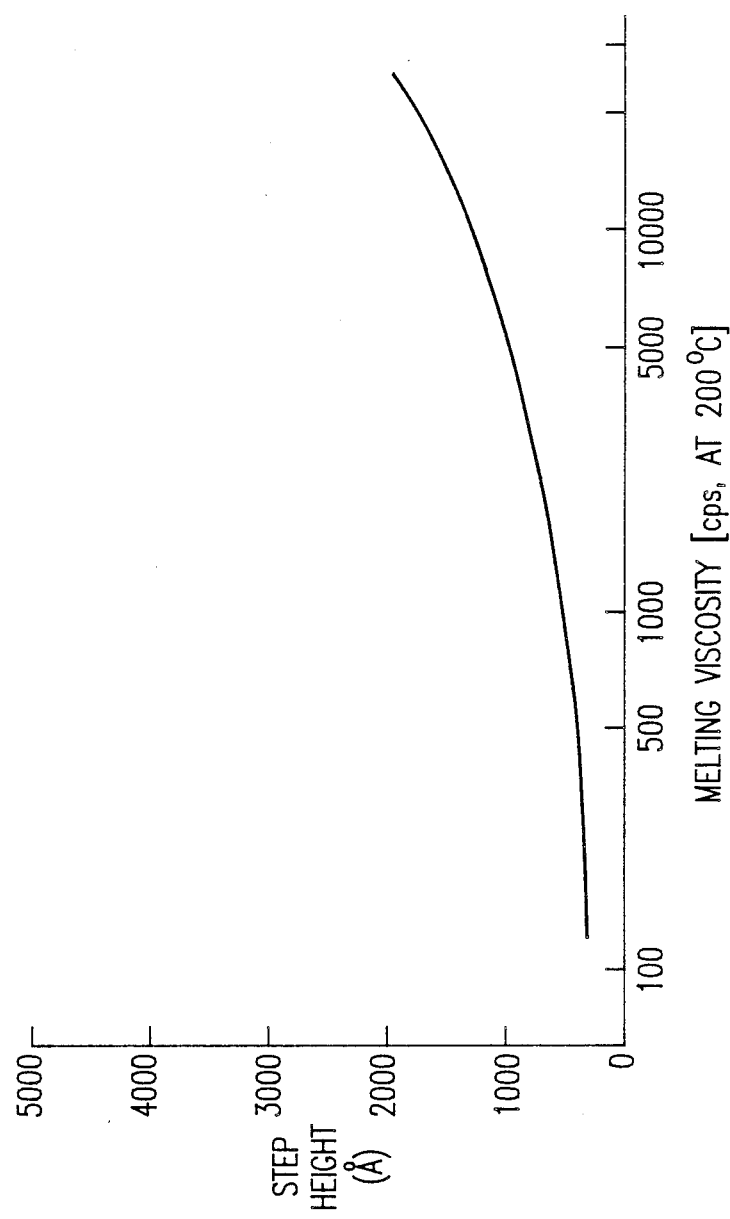
FIG. 4 is a relationship of melting viscosity and step height.

FIG. 4 shows step height at 40 μm pattern widths, obtained by 7,000 Å spincoating and 200° C. baking, as a function of melting viscosity.

The initial step height of 6,200 Å is suppressed within 1,000 Å when the melting viscosity is below 5,000 cps. Also required of these polymers is the durability to withstand the etching process. Since the Tg for these polymers is low, temperature rise during etching may be suppressed by effectively cooling the etching table in RIE (reactive ion etching). An alternative is to raise the Tg by crosslinking the polymer with deep-UV irradiation before etching. Etching may be performed under $CF_4/O_2$-RIE. With increasing $O_2$ partial pressure, the etching rate of $SiO_2$ is decreased while that of the polymer is increased. That is to say, equal etching rates can be achieved at 40 sccm $CF_4$ and 5 sccm $O_2$.

When the amount of absorbed water and hydroxy radical on the dielectric film is a little, the melted polymer condenses and forms sphere-shaped droplets on the dielectric film under baking.

The condensation of the melted polymer can be prevented by the forming of the organic film produced from the compound represented by formula (2) before forming of the polymer on the dielectric film, or by addition of the polysiloxane represented by formula (3) to the polymer, because interfacial tension between the polymer and the dielectric film becomes higher by these methods.

In order to indicate more fully the nature and utility of this invention, the following specific examples of practice constituting preferred embodiments of the invention and results are set forth.

EXAMPLE 1

A polymer solution used for planarization was made from a styrene-chloromethylstyrene copolymer having Mw of 2,500, Mw/Mn of 3.0, chloromethylstyrene unit of 50 mol % and the viscosity of 100 cps at 200° C. and xylene. The concentration of the polymer was 30% by weight (Solution 1).

Planarization was carried out as follows:

forming $SiO_2$ film of 8000 Å over a pattern having the step height of 6000 Å on a substrate of a semiconductor; forming a polymer layer of 7000 Å over $SiO_2$ film by spin-coating said solution thereon; baking at 200° C. for an hour under $N_2$ flow condition; hardening the polymer for a minute with deep-UV radiation from 500 W Hg-Xe lamp (its output being 65 mw/cm$^2$ at 310 nm); and dry-etching said polymer layer to transfer the planar surface to $SiO_2$ film with Reactive Ion Etcher, under the condition of $O_2$ flow of 2.5 sccm, $CF_4$ flow of 30 sccm, pressure of 4.5 Pa and power of 100 W.

After etching, the step height of $SiO_2$ film over a substrate was suppressed within 0.05 μm at the step width of 50 μm to obtain an excellently planar surface.

EXAMPLE 2

A solution of the polymer using for planarization was made from styrenechloromethylstyrene copolymer having Mw of 1,000, Mw/Mn of 1.1, chloromethylstyrene unit of 50 mol % and the viscosity of 10 cps at 200° C. and xylene. The concentration of the polymer was 35% by weight. (Solution 2).

Planarization was carried out as same as in EXAMPLE 1.

After etching, the step height of $SiO_2$ film over a substrate was suppressed within 0.05 μm at the step width of 100 μm to obtain a more excellently planar surface.

EXAMPLE 3

Planarization was carried out as follows:

forming $SiO_2$ film of 8000 Å over a pattern having the step height of 6000 Å on a substrate of a semiconductor; forming an organic film produced by exposing with 3-aminopropyltrimethoxysilane at room temperature for 20 minutes (Chemical Vapor Deposition); forming a polymer layer of 7000 Å over $SiO_2$ film by spin-coating Solution 2 in EXAMPLE 2 thereon; baking at 220° C. for an hour under $N_2$ flow condition; followed by hardening and dry-etching as same as in EXAMPLE 1.

After etching, the step height of $SiO_2$ film over a substrate was suppressed within 0.05 μm at the step width of 100 μm obtain a more excellently planar surface.

EXAMPLE 4

EXAMPLE 3 was repeated except using γ-(2-aminoethyl)aminopropyltrimethoxysilane instead of 3-aminopropyltrimethoxysilane.

The result of planalization of $SiO_2$ film over a substrate was the same as in EXAMPLE 3.

EXAMPLE 5

A solution of a composition for planarization was made from styrenechloromethylstyrene copolymer having Mw of 1,000, Mw/Mn of 1.1, chloromethylstyrene unit of 50 mol % and the viscosity of 10 cps at 200° C., a polymethylphenylsiloxane (sold by Toray silicone Co. Ltd. SH-710) and xylene. The quantity of the polymethylphenylsiloxane in a composition was 3% by weight. The concentration of the composition was 35% by weight (Solution 3).

Planarization was carried out as same as in EXAMPLE 2 except using Solution 2 instead of Solution 3.

The result of planarization of $SiO_2$ film over a substrate was the same as in EXAMPLE 2.

EXAMPLE 6

Example 5 was repeated except using an α-methylstyrene-dimethylsiloxane copolymer (sold by Chisso Corp. PS-096) instead of the polymethylphenylsiloxane.

The result of planarization of $SiO_2$ film over a substrate was the same as in EXAMPLE 5.

EXAMPLE 7

A solution of the composition for planarization was the same as Solution 3 in EXAMPLE 5 except increasing the composition concentration of 35% to 45% (Solution 5).

Planarization was carried out as follows:

forming $SiO_2$ film of 20,000 Å over a pattern having the step height of 15,000 Å on Si wafer by the method of Plasma Chemical Vapour Deposition; forming a polymer layer of 12,000 Å over $SiO_2$ film by spin-coating Solution 5 thereon; reducing the viscosity of said polymer layer under baking to create substantially planar surface within 0.05 μm at the step width of 100 μm and 250 μm, though the thickness of the polymer layer less than the step heights; followed by hardening and dry-etching as same as in EXAMPLE 1.

After etching the step height of $SiO_2$ film over a substrate was suppressed within 0.05 μm at the step width of 100 μm and 200 μm.

What is claimed as new and intended to be covered by Letters Patent is:

1. A method for producing a semiconductor structure over a substrate having a pattern thereon, said pattern comprising mesa-like portions having a trench region therebetween, the steps comprising:

(a) forming a dielectric film over the mesa-like portions and the trench region;

(b) forming a polymer layer over said dielectric film, said polymer layer comprising a polymer having a melting viscosity of 5000 cps or less at 200° C. and the formula:

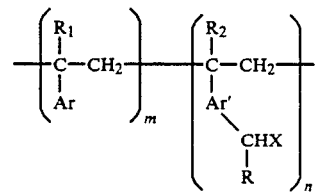

in which:

R$_1$ is a hydrogen atom, a methyl radical or a halogen atom;

R$_2$ is a hydrogen atom, a methyl radical or a halogen atom;

R is a hydrogen atom or a methyl radical;

X is a halogen atom;

Ar is a phenyl radical;

Ar' is a phenylene radical;

m and n are zero or a positive integer, each of which can not be zero at the same time, wherein the ratio of n/m is not less than 5/95;
(c) reducing the viscosity of said polymer layer under baking to create a substantially planar surface;
(d) hardening the polymer with radiation or an electron beam to improve the heat resistance of said polymer layer; and
(e) dry-etching said polymer layer to transfer the planar surface to said dielectric film.

2. A method as described in claim 1, wherein the polymer has a weight-average molecular weight of from 500 to 1500 and a molecular weight distribution smaller than 1.5.

3. A method as described in claim 1 wherein the ratio of m:n is from 95:5 to 10:90.

4. A method as described in claim 2 wherein the ratio of m:n is from 95:5 to 10:90.

5. A method for producing a semiconductor structure over a substrate having a pattern thereon, said pattern comprising mesa-like portions having a trench region therebetween, the steps comprising:
(a) forming a dielectric film over the mesa-like portions and trench region;
(b) forming an organic film containing at least one amino radical and at least one alkoxysilyl radical over said dielectric film;
(c) forming a polymer layer over said organic film, said polymer layer comprising a polymer having the melting viscosity of 5000 cps or less at 200° C. and the formula:

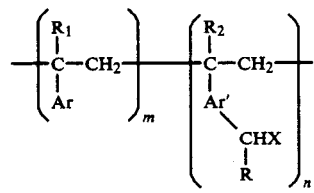

in which:
R₁ is a hydrogen atom, a methyl radical or a halogen atom;
R₂ is a hydrogen atom, a methyl radical or a halogen atom;
R is a hydrogen atom or a methyl radical;
X is a halogen atom;
Ar is a phenyl radical;
Ar' is a phenylene radical;
m and n are zero or a positive integer, each of which can not be zero at the same time;
(d) reducing the viscosity of said polymer layer under baking to create a substantially planar surface;
(e) hardening the polymer with radiation or an electron beam to improve the heat resistance of said polymer layer; and
(f) dry-etching said polymer layer to transfer the planar surface to said dielectric film.

6. A method as described in claim 5, wherein the organic film is produced from the compound having the formula;

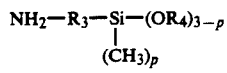  (2)

in which:
R₃ is a p-phenylene, a trimethylene, an butylene or a dimethyleneaminotrimethylene radical;
R₄ is a methyl or an ethyl radical;
p is an integral number from zero to 2.

7. A method as described in claim 6, wherein the polymer has a weight-average molecular weight of from 500 to 1500 and a molecular weight distribution smaller than 1.5.

8. A method as described in claim 6 wherein the ratio of m:n is from 95:5 to 10:90.

9. A method as described in claim 7 wherein the ratio of m:n is from 95:5 to 10:90.

10. A method for producing a semiconductor structure over a substrate having a pattern thereon, said pattern comprising mesa-like portions having a trench region therebetween, the steps comprising:
(a) forming a dielectric film over the mesa-like portions and the trench region;
(b) forming a polymer layer over said dielectric film, said polymer layer comprising a polymer having a melting viscosity of 5000 cps or less at 200° C. and the formula:

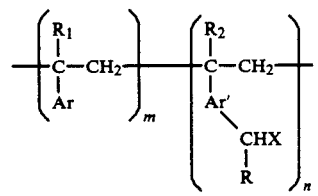

in which:
R₁ is a hydrogen atom, a methyl radical or a halogen atom;
R₂ is a hydrogen atom, a methyl radical or a halogen atom;
R is a hydrogen atom or a methyl radical;
X is a halogen atom;
Ar is a phenyl radical;
Ar' is a phenylene radical;
m and n are zero or a positive integer, each of which can not be zero at the same time, and a polysiloxane, wherein said polymer layer contains said polysiloxane in an amount of from 0.001% to 40% by weight;
(c) reducing the viscosity of said polymer layer under baking to create a substantially planar surface;
(d) hardening the polymer with radiation or an electron beam to improve the heat resistance of said polymer layer; and
(e) dry-etching said polymer layer to transfer the planar surface to said dielectric film.

11. A method as described in claim 10, wherein the ratio of n/m is not less than 5/95.

12. A method as described in claim 10, wherein the polymer has a weight average molecular weight of from 500 to 1500 and a molecular weight distribution smaller than 1.5.

13. A method as described in claim 11, wherein the ratio of m:n is from 95:5 to 10:90.

14. A method as described in claim 12, wherein the ratio of m:n is from 95:5 to 10:90.

15. A composition suitable for planarization of dielectric films, which comprises a polymer and a polysiloxane, said polymer having the melting viscosity of 5000 cps or less at 200° C. and the formula:

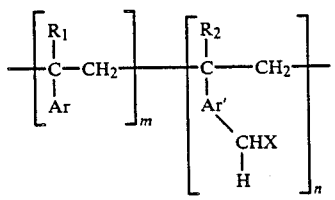 (1)

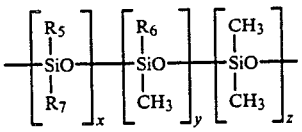 (3)

in which:
- $R_1$ is a hydrogen atom, a methyl radical or a halogen atom;
- $R_2$ is a hydrogen atom, a methyl radical or a halogen atom;
- R is a hydrogen atom or a methyl radical;
- X is a halogen atom;
- Ar is a phenyl radical;
- Ar' is a phenylene radical;
- m and n are zero or a positive integral number and aren't zero at the same time;

16. A composition as described in claim 15, wherein the polysiloxane has the formula:

in which:
- $R_5$, $R_6$ and $R_7$ are independently selected from the group consisting of an alkyl radical, a substituted alkyl radical, an aryl radical and a substituted aryl radical;
- x, y and z are zero or a positive integral number.

17. A composition as described in claim 16, wherein said polysiloxane is contained in amount of from 0.001% to 40% by weight.

18. A composition as described in claim 17, wherein the polymer has a weight average molecular weight of from 500 to 1500 and a molecular weight distribution smaller than 1.5.

19. A composition as described in claim 17, wherein the ratio of m:n is from 95:5 to 10:90.

20. A composition as described in claim 18, wherein the ratio of m:n is from 95:5 to 10:90.

* * * * *